United States Patent
Mills (10) Patent No.: US 9,337,137 B1
(45) Date of Patent: May 10, 2016

(54) METHOD AND SYSTEM FOR SOLDER SHIELDING OF BALL GRID ARRAYS

(71) Applicant: Torry Mills, Gilbert, AZ (US)

(72) Inventor: Torry Mills, Gilbert, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 198 days.

(21) Appl. No.: 13/663,001

(22) Filed: Oct. 29, 2012

(51) Int. Cl.
*H01L 23/48* (2006.01)
*H01L 23/522* (2006.01)
*H01L 29/40* (2006.01)

(52) U.S. Cl.
CPC .............. *H01L 23/522* (2013.01); *H01L 29/40* (2013.01); *H01L 2224/13099* (2013.01); *H01L 2924/00014* (2013.01); *H01L 2924/01047* (2013.01)

(58) Field of Classification Search
CPC ........... H01L 2924/00014; H01L 2224/13099; H01L 2224/131; H01L 2224/13111; H01L 2224/13116; H01L 2224/13139; H01L 2924/0001; H01L 2924/01029; H01L 2924/01033; H01L 2924/01047; H01L 2924/01082
USPC ................. 257/738, 737, 778, 690, 712, 710; 710/305
See application file for complete search history.

(56) References Cited

U.S. PATENT DOCUMENTS

| | | | | |
|---|---|---|---|---|
| 5,866,943 | A * | 2/1999 | Mertol | 257/712 |
| 6,285,079 | B1 * | 9/2001 | Kunikiyo | 257/737 |
| 6,403,896 | B1 * | 6/2002 | Ma et al. | 174/261 |
| 6,735,857 | B2 * | 5/2004 | Saito et al. | 29/840 |
| 6,736,306 | B2 | 5/2004 | Byun et al. | |
| 2002/0113309 | A1 | 8/2002 | Fazelpour | |
| 2004/0026794 | A1 * | 2/2004 | Tao et al. | 257/778 |
| 2010/0283141 | A1 * | 11/2010 | Chang et al. | 257/690 |
| 2011/0283034 | A1 * | 11/2011 | Kang et al. | 710/305 |

* cited by examiner

*Primary Examiner* — Mohammed Shamsuzzaman
(74) *Attorney, Agent, or Firm* — McAndrews Held & Malloy (57) ABSTRACT

Methods and systems for solder shielding of ball grid arrays are disclosed and may include placing an array of solder balls onto a substrate, where the substrate may comprise a contact pad for each of the solder balls and a subset of the contact pads may be coupled via a solder mask opening. A subset of the array of solder balls may be coupled utilizing a solder reflow process and via the solder mask opening. The coupled subset may comprise an outer perimeter of the array. The substrate may comprise an interposer or an integrated circuit die, where the coupled subset shields circuitry from receiving electromagnetic interference. The substrate may comprise a packaging substrate or a printed circuit board (PCB) and the coupled subset may be coupled to a ground plane. The subset of the array of solder balls may be utilized to generate one or more reactive elements.

18 Claims, 8 Drawing Sheets

METHOD AND SYSTEM FOR SOLDER SHIELDING OF BALL GRID ARRAYS

FIELD OF THE INVENTION

Certain embodiments of the invention relate to semiconductor chip packaging. More specifically, certain embodiments of the invention relate to a method and system for solder shielding of ball grid arrays.

BACKGROUND OF THE INVENTION

Semiconductor packaging protects integrated circuits, or chips, from physical damage and external stresses. In addition, it can provide a thermal conductance path to efficiently remove heat generated in the chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present invention as set forth in the remainder of the present application with reference to the drawings.

DETAILED DESCRIPTION OF THE INVENTION

Certain aspects of the invention may be found in a method and system for solder shielding of ball grid arrays. Example aspects of the invention may comprise placing an array of conductive balls onto a substrate, where the substrate may, for example, comprise a contact pad for each of the conductive balls and a subset of the contact pads may, for example, be coupled via a solder mask opening. A subset of the array of conductive balls may, for example, be coupled utilizing a solder reflow process and via the solder mask opening. The coupled subset of the array of conductive balls may, for example, comprise an outer perimeter of the array of solder balls. The coupled subset of the array of solder balls may, for example, be coupled to ground. The substrate may, for example, comprise an interposer die. The substrate may, for example, comprise an integrated circuit, wherein the coupled subset of the array of solder balls shields the integrated circuit from receiving electromagnetic interference. The substrate may, for example, comprise a packaging substrate and the coupled subset of the array of conductive balls may, for example, be coupled to a ground plane in the packaging substrate. The substrate may, for example, comprise a printed circuit board and the coupled subset of the array of solder balls may, for example, be coupled to a ground plane in the printed circuit board. The subset of the array of solder balls may, for example, be utilized to generate one or more capacitors and/or one or more inductors.

Figure 1A:
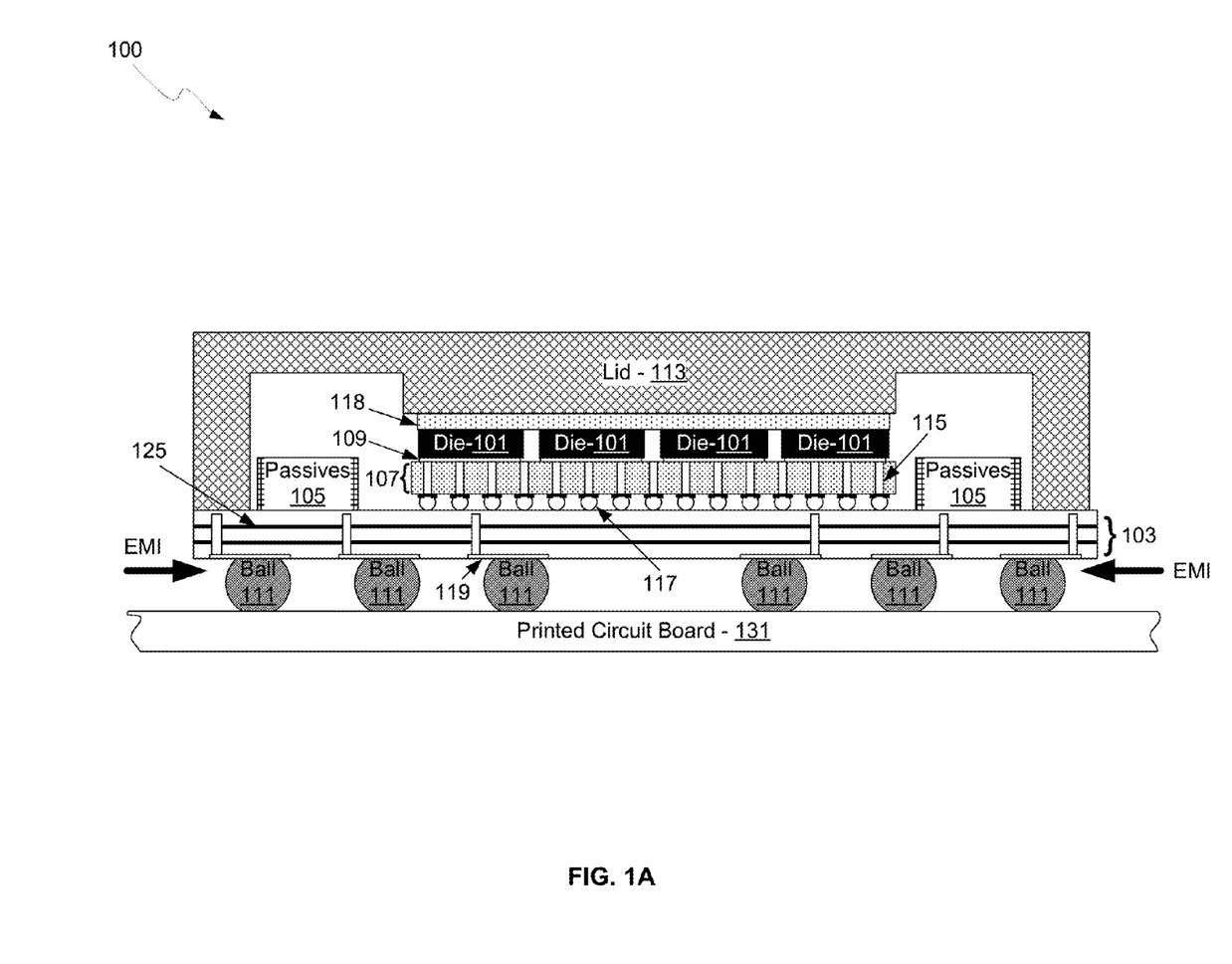
FIG. 1A is a schematic illustrating an integrated circuit package with multiple die, in accordance with an example embodiment of the invention.

FIG. 1A is a schematic illustrating an integrated circuit package with multiple die, in accordance with an example embodiment of the invention. Referring to FIG. 1A, there is shown a package 100 comprising a plurality of die 101, a packaging substrate 103, passive devices 105, an interposer 107, conductive balls 111, a lid 113, thermal interface material 118, and a printed circuit board 131.

The plurality of die 101 may comprise integrated circuit die that have been separated from one or more semiconductor wafers. The plurality of die 101 may comprise electrical circuitry such as digital signal processors (DSPs), network processors, power management units, audio processors, RF circuitry, wireless baseband system-on-chip (SoC) processors, sensors, and application specific integrated circuits, for example. In addition, the plurality of die 101 may comprise micro-bumps 109 for providing electrical contact between the circuitry in the plurality of die 101 and contact pads on the surface of the interposer die 107.

The interposer 107 may comprise a semiconductor die, such as a silicon die, with through-silicon-vias (TSVs) 115 that provide electrically conductive paths from one surface of the interposer 107 to the opposite surface. The interposer 107 may also comprise backside bumps 117 for making electrical and mechanical contact to the packaging substrate 103. In another example scenario, the interposer 107 may comprise glass or an organic laminate material, either of which may be capable of large panel formats on the order of 500×500 mm, for example.

The packaging substrate 103 may comprise a mechanical support structure for the interposer 107, the plurality of die 101, the passive devices 105, and the lid 113. The packaging substrate 103 may comprise conductive balls 111 (or any of a variety of conductive or solder balls, or alternative conductive structures) on the bottom surface for providing electrical contact to external devices and circuits, for example. The packaging substrate 103 may also comprise conductive traces in a non-conductive material for providing conductive paths from the solder balls to the plurality of die 101 via pads that are configured to receive the backside bumps 117 on the interposer 107. Additionally, the packaging substrate 103 may comprise pads 119 for receiving the conductive balls 111. The pads 119 may comprise one or more under-bump metals, for example, for providing a proper electrical and mechanical contact between the packaging substrate 103 and the conductive balls 111.

The packaging substrate 103 may be bonded to the printed circuit board 131, which may provide further support for the packaging substrate 103, the interposer 107, and the plurality of die 101. In addition, the packaging substrate 103 may comprise one or more ground planes 125 for circuit grounding purposes and electromagnetic interference (EMI) shielding. The printed circuit board 131 may provide support for a plurality of packaging substrate, interposer, and die assemblies in an electronics device, for example.

The passive devices 105 may comprise electrical devices such as resistors, capacitors, and inductors, for example, which may provide functionality to devices and circuits in the plurality of die 101. The passive devices 105 may, for example, comprise devices that are difficult to integrate in the integrated circuits in the plurality of die 101, such as high value capacitors or inductors. In another example scenario, the passive devices 105 may comprise one or more crystal oscillators for providing one or more clock signals to the plurality of die 101.

The lid 113 may provide a hermetic seal for the devices within the cavity defined by the lid 110 and the packaging substrate 103. In addition, the lid 113 may provide interference shielding for signals received from above the plurality of die 101. A thermal interface may be created for heat transfer out of the plurality of die 101 to the lid 113 via the thermal interface material 118, which may also act as an adhesive.

In an example scenario, the package 100 may be susceptible to electromagnetic interference. The lid 113 may be utilized to shield some of the interference, but fields may also be coupled into the circuitry via the conductive balls 111, as illustrated by the electromagnetic interference (EMI) labels in FIG. 1A for example. Accordingly, an outer ring of the conductive balls 111 may be coupled together in a solder reflow process. This may be accomplished by, for example, a trough-like opening (or channel) in the solder mask connecting the individual solder ball pads, where capillary action causes the solder balls to connect via the opening. In addition to solder balls, the technique may be applied to any metal contact technology, for example where a reflow process may be utilized to connect metal contacts in a shield surround an array of contacts.

In an example scenario, the lid 113 may be electrically coupled to the coupled solder balls, with the lid 113 and the coupled solder balls electrically coupled to ground, such as the ground plane 125, for example, thereby providing an electromagnetic interference shield for signals from a plurality of directions. Similarly, the lid 113 and the coupled solder balls may be electrically coupled to one or more ground planes in the plurality of die 101, the interposer 107, and/or the printed circuit board 131.

Figure 1B:
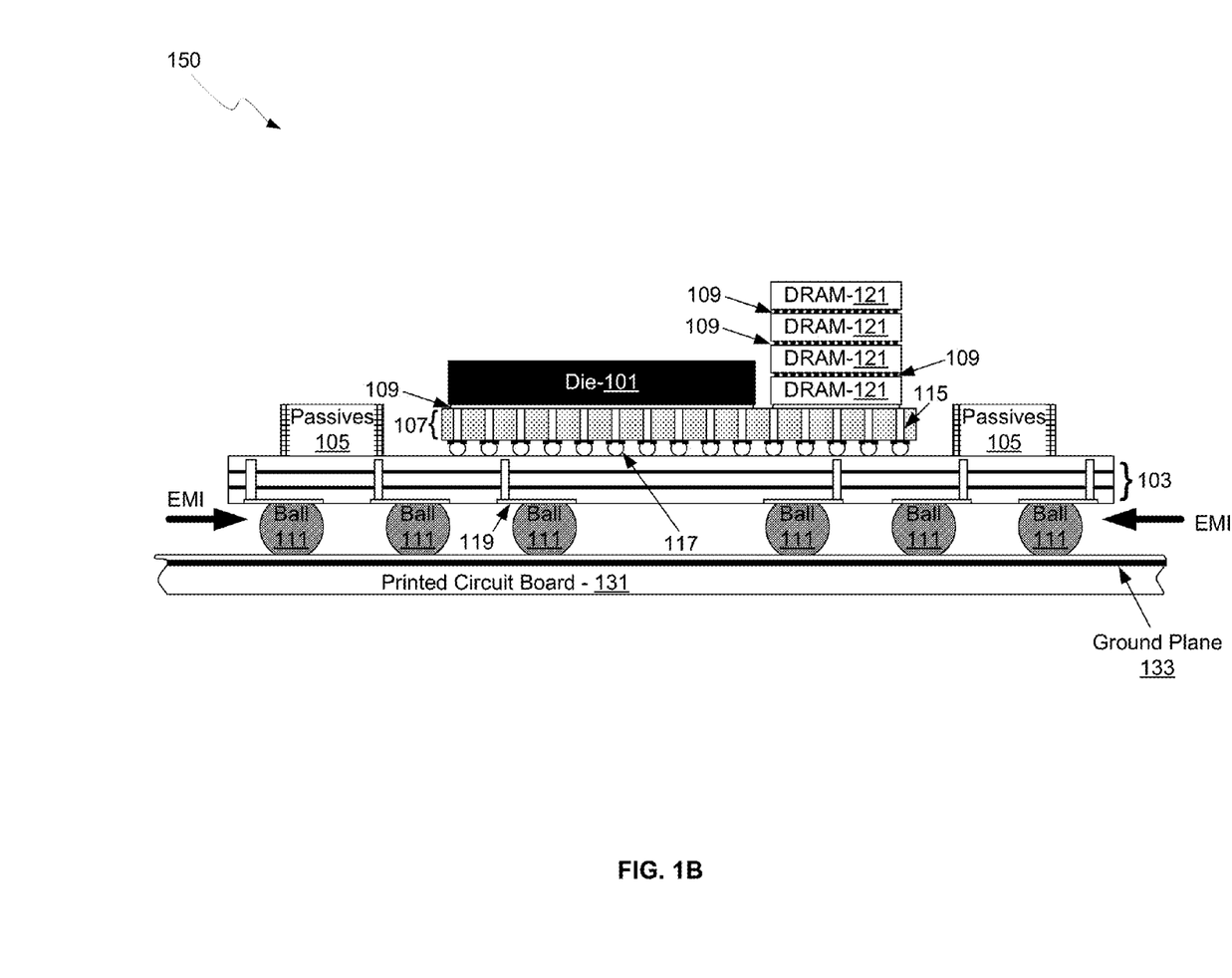
FIG. 1B is a schematic illustrating an integrated circuit package with stacked die, in accordance with an example embodiment of the invention.

FIG. 1B is a schematic illustrating an integrated circuit package with stacked die, in accordance with an embodiment of the invention. Referring to FIG. 1B, there is shown a package 150 comprising a die 101, the packaging substrate 103, the passive devices 105, the interposer 107, a stack of dynamic random access memory (DRAM) 121, and a printed circuit board 131. The die 101, the packaging substrate 103, the passive devices 105, the interposer 107, and the printed circuit board 131 may be substantially as described with respect to FIG. 1A, for example, but with different electrical connectivity for the different die 101 and the stack of DRAM 121.

The DRAM 121 may comprise a stack of die for providing a high density memory for circuitry in the die 101 or external to the package 150. The DRAM 121 may be stacked front-to-back and therefore comprise TSV's for providing electrical connectivity between the individual die.

In an example scenario, the performance of the circuitry in the package 150 may be degraded by electromagnetic interference (EMI) from external sources, as indicated by the EMI labels in FIG. 1B. A lid, as shown in FIG. 1A, may provide some protection, but signals may still be coupled into the die 101 via the conductive balls 111 and the backside bumps 117, for example. An electromagnetic shield may be created by connecting a ring of outer solder balls in a ball grid array. Similarly, a plurality of shield rings may be formed for shielding off different sections of solder balls. For example, two rings may be formed by interconnected conductive balls, or solder balls, around the outside as well as inside of sensitive solder ball connections, with each interconnected ring coupled to a ground plane, for example, thereby isolating the solder balls confined by the interconnected solder balls.

In an example scenario, the coupled solder balls may also be electrically coupled to ground, such as the ground plane 133, for example. Similarly, the coupled solder balls may be electrically coupled to one or more ground planes in the die 101, the interposer 107, and/or the packaging substrate 103.

It should be noted that the packaging embodiments shown in FIGS. 1A and 1B are merely examples. Accordingly, any packaging technology may be utilized with the solder ball electromagnetic shield such as plastic substrate ball grid array (PBGA), chip array ball grid array (CABGA), stacked chip scale package (SCSP), flip chip scale package (FCCSP), flip chip ball grid array (FCBGA), etc.

Figure 2:
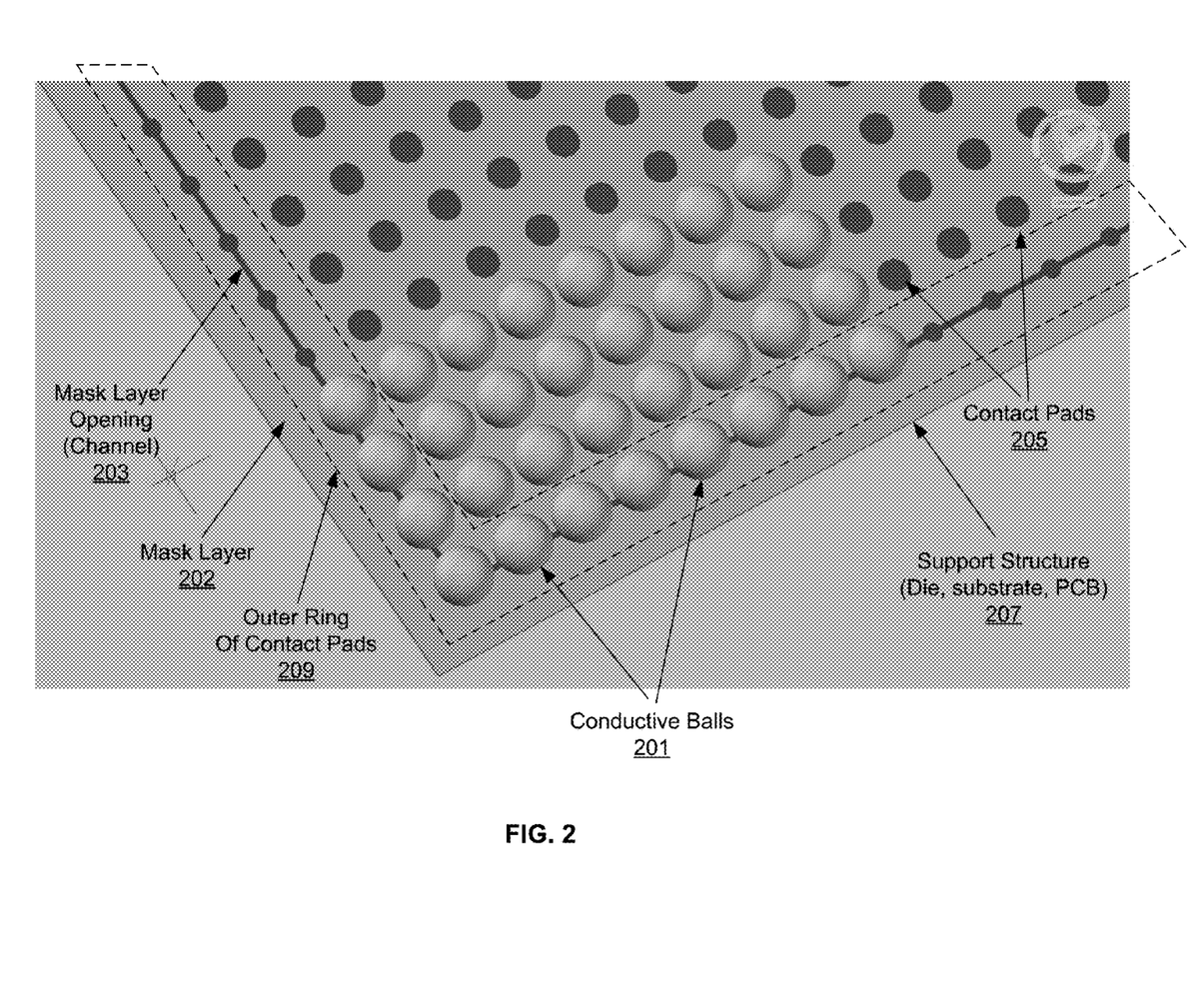
FIG. 2 is a schematic illustrating shielding for a ball grid array, in accordance with an example embodiment of the invention.

FIG. 2 is a schematic illustrating shielding for a ball grid array, in accordance with an embodiment of the invention. Referring to FIG. 2, there is shown conductive balls 201 forming an array, a mask layer 202, a mask layer opening 203, contact pads 205, and a support structure 207. The conductive balls 201 may comprise spheres of metal (e.g., a reflowable metal, such as solder balls) for providing electrical as well as mechanical contact between the support structure 207 and a die, substrate, or printed circuit board, for example. The support substrate 207 may comprise a functional die, a packaging substrate, and interposer die, or a printed circuit board, for example.

As illustrated in the example shown in FIG. 2, the contact pads 205 in the interior of the array (e.g., a matrix) of pads may have a larger or smaller diameter (or generally larger surface area) than the contact pads around the perimeter (e.g., those pads between which pathways are formed via the solder mask openings 203). For example, the contact pads 205 in the interior of the array of pads (or the exposed portions thereof) may be at least 10% larger than the contact pads around the perimeter. Also for example, the contact pads 205 in the interior of the array of pads (or the exposed portions thereof) may be at least 20% (or 50%) larger than the contact pads around the perimeter. Note that in various other examples, any or all contact pads may be sized equally. Furthermore, a plurality of the perimeter contact pads may be electrically connected by traces, for example to enhance conductivity and/or solder flow.

The support structure 207 may comprise a functional electronic die, an interposer die, a packaging substrate, or a printed circuit board, for example, which may provide a surface for the metal contact pads 205 to receive the conductive balls 201. The mask layer 202 may comprise an insulating layer on the top surface of the support structure 207. The mask layer 202 may thus insulate adjacent contact pads 205 electrically and provide a physical boundary for the contact pads 205.

The contact pads 205 on the interior of the array may comprise isolated pads, as compared to the outer ring of the contact pads 209, which may be interconnected by the mask layer opening 203. In a solder reflow process, the mask layer opening 203 may enable the conductive balls 201 in the outer ring 209 to couple together through a capillary action of the metal. This is shown further with respect to FIGS. 3 and 4.

Figure 3:
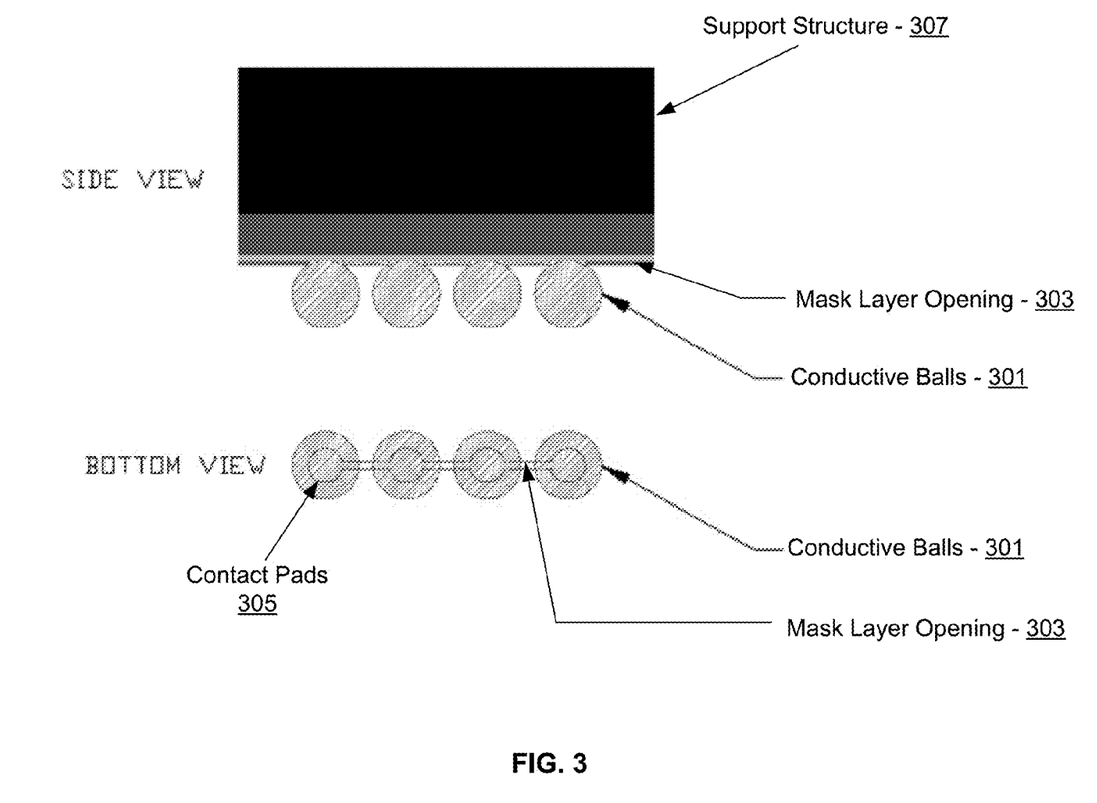
FIG. 3 is a schematic illustrating an outer row of a ball grid array prior to solder reflow, in accordance with an example embodiment of the invention.

FIG. 3 is a schematic illustrating an outer row of a ball grid array prior to solder reflow, in accordance with an example embodiment of the invention. Referring to FIG. 3, there is shown various views of a support structure 307 with conductive balls 301, mask layer opening 303, and contact pads 305 prior to being subjected to a solder reflow process.

The conductive balls 301 may be substantially similar to the conductive balls 111 and 201 described with respect to FIGS. 1A, 1B, and 2, and are illustrated as isolated solder balls not in physical contact with each other.

The support structure 307 may comprise a functional electronic die, an interposer die, a packaging substrate, or a printed circuit board, for example, which may provide a surface for the contact pads 305 to receive the conductive balls 301 and the mask layer opening 303 coupling the contact pads 305. The mask layer opening 303 may enable the solder balls to make physical contact process via capillary action during a subsequent solder reflow process, where for example, exposed metal traces in the mask opening 303 assists the capillary flow. In this manner a "curtain" of interconnected solder balls may provide shielding of electromagnetic interference for other solder ball connections. The mask layer opening 303 and/or contact pad 305 size may be characterized by any of a variety of dimensions. For example, the mask layer opening 303 may extend between adjacent contact pads 305 and may have a width of less than ½ of the contact pad 305 diameter (or alternatively less than ¼ of the contact pad diameter).

In another example scenario, various structures, such as reactive circuit elements, may be generated by coupling solder balls. For example, parallel lines of coupled solder balls may be utilized to create large area capacitors. In such a scenario, the space between the coupled solder balls may be filled with a dielectric material. Similarly, large inductance values may be obtained with spiral-connected solder balls. Such reactive elements may be useful for noise suppression in integrated circuits, for example.

Figure 4:
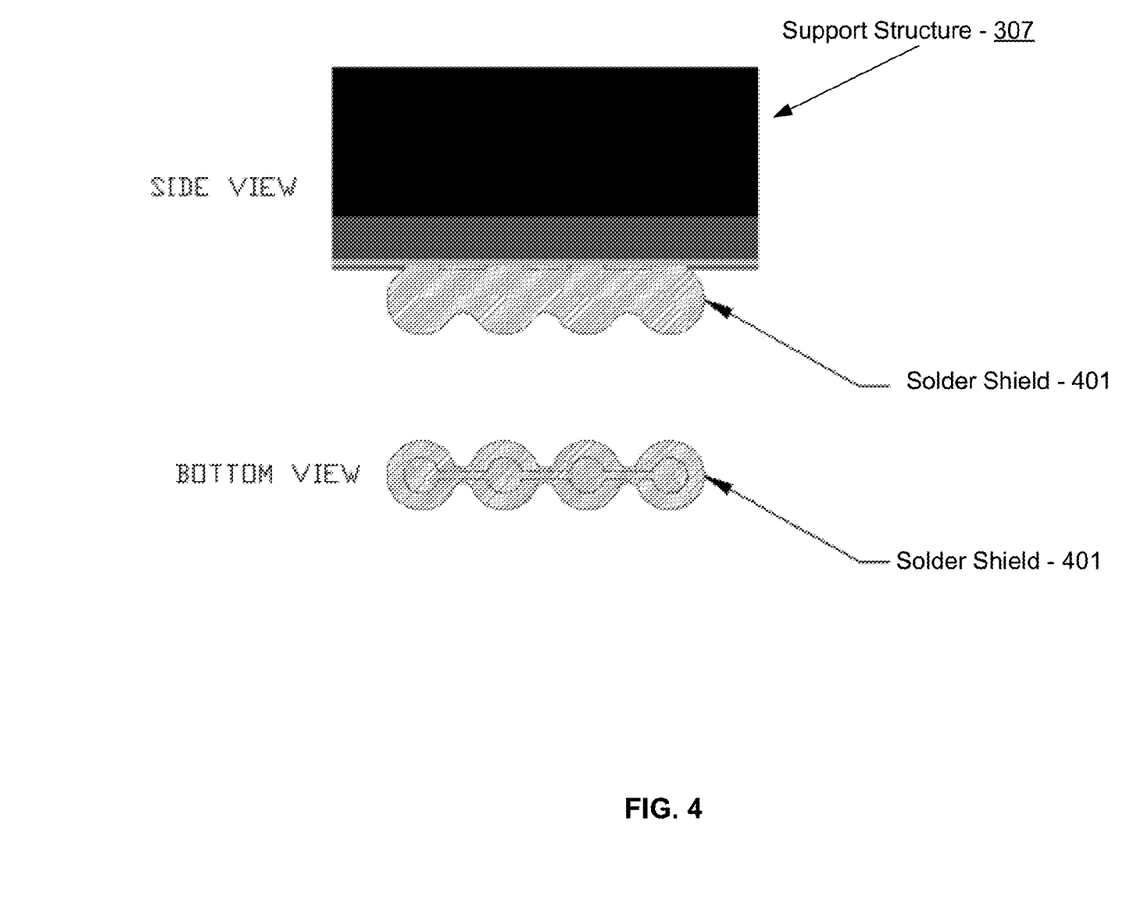
FIG. 4 is a schematic illustrating an outer row of a ball grid array following solder reflow, in accordance with an example embodiment of the invention.

FIG. 4 is a schematic illustrating an outer row of a ball grid array following solder reflow, in accordance with an example embodiment of the invention. Referring to FIG. 4, there is shown the support structure 307 and a solder shield 401. The support structure 307 may be as described with respect to FIG. 3, for example, and the solder shield 401 may comprise a row of solder balls interconnected during a solder reflow process.

The solder shield 401 may be generated by a solder reflow process performed on the structure illustrated in FIG. 3. The conductive balls may be interconnected through a capillary action of metal during the solder reflow process. The solder mask opening 303 may provide a path for metal to flow via capillary action, thereby connecting adjacent conductive balls that have a solder mask opening between their respective contact pads.

The solder shield 401 may be biased at ground, or some other potential, during operation of the associated circuitry thereby providing shielding of electromagnetic interference for other conductive balls. In an example scenario, the solder shield 401 may be coupled to a ground plane in the substrate 407 as well as ground planes in one or more other coupled substrates, die, or printed circuit boards, such that sensitive circuitry may be almost entirely enclosed by ground-connected material, if desired.

Figure 5:
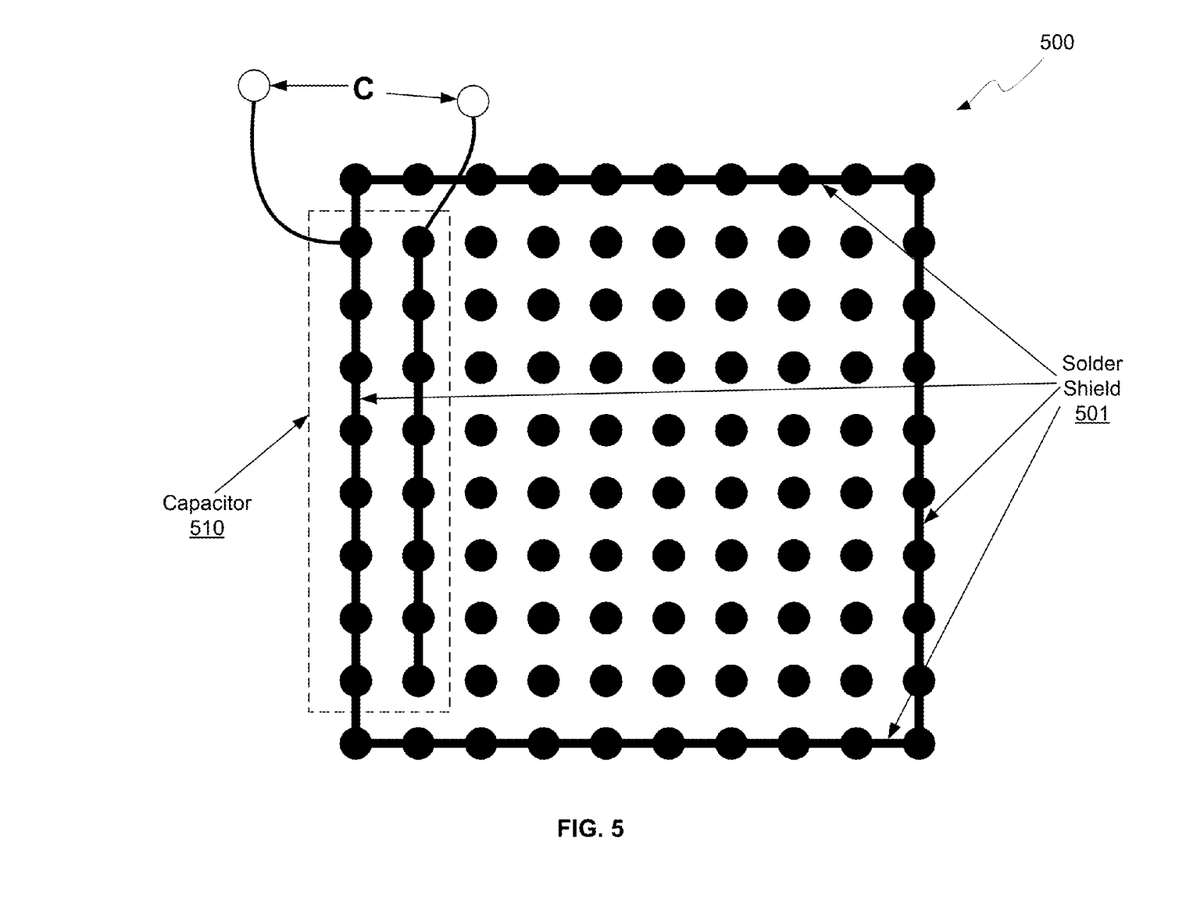
FIG. 5 is a schematic illustrating a capacitor element in a ball grid array with a solder shield, in an example embodiment of the invention.

FIG. 5 is a schematic illustrating a capacitor element in a ball grid array with a solder shield, in an example embodiment of the invention. Referring to FIG. 5, there is shown conductive balls 500 forming an array of solder balls, for example, similar to the conductive balls illustrated in FIGS. 1A-4. The size, number, and pattern of the conductive balls illustrated in FIG. 5 are merely examples. Accordingly, any number and of conductive balls in any pattern is possible as determined by the solder ball size and substrate area, for example.

The outer perimeter of the conductive balls 500 may comprise the solder shield 501 generated utilizing a solder mask opening and a solder reflow process, as illustrated in FIGS. 2-4, for example.

In an another example embodiment, one or more capacitors may also be generated utilizing a solder mask opening and a solder reflow process to couple parallel rows of conductive balls, as is illustrated by the capacitor 510. In this manner, large area capacitors may be configured to work in conjunction with the solder shield 501 and large area inductors to reduce noise in the associated electronics.

Figure 6:
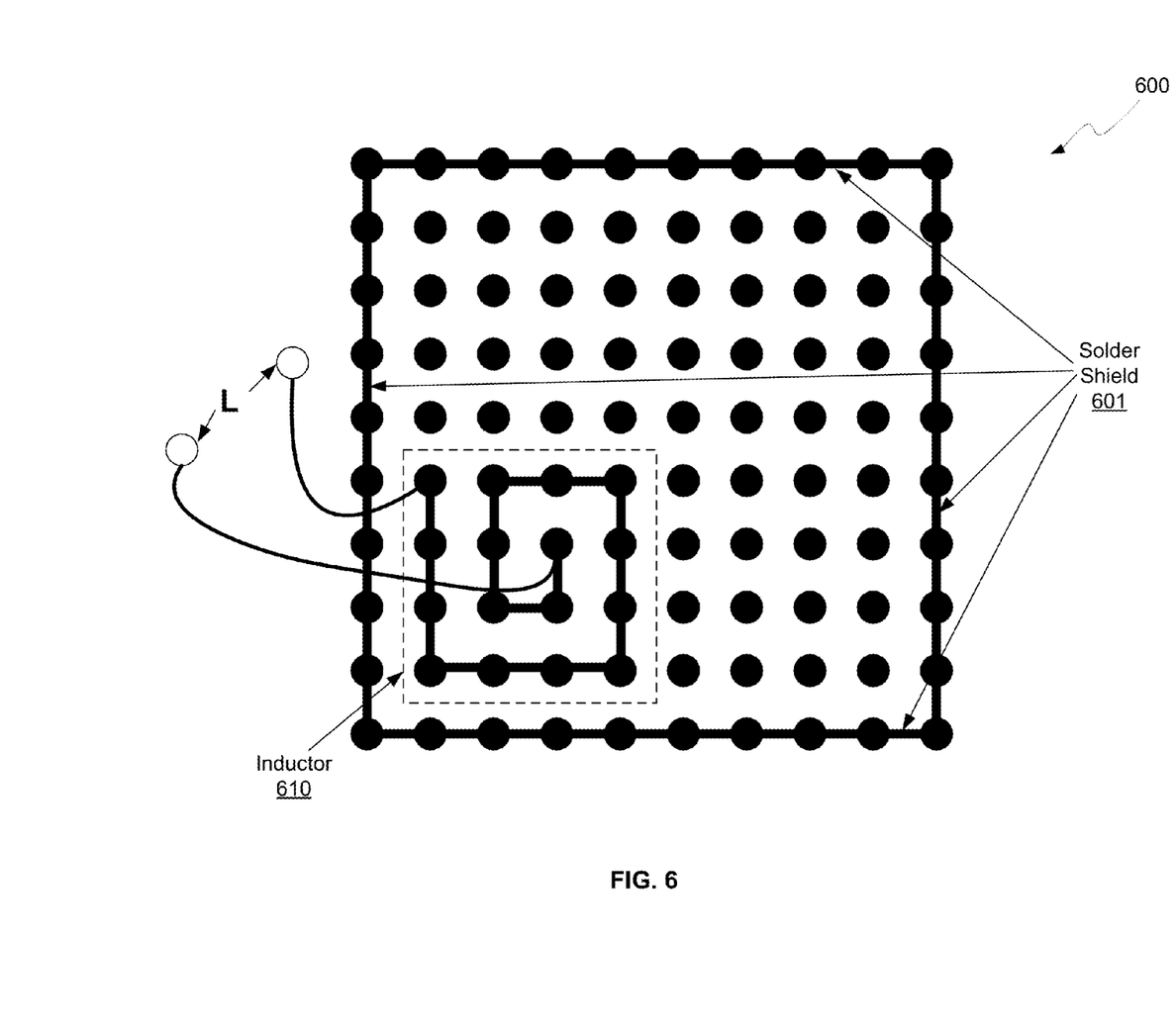
FIG. 6 is a schematic illustrating an inductor element in a ball grid array with a solder shield, in an example embodiment of the invention.

FIG. 6 is a schematic illustrating an inductor element in a ball grid array with a solder shield, in an example embodiment of the invention. Referring to FIG. 6, there is shown conductive balls 600 forming an array of solder balls, similar to those illustrated in FIGS. 1A-5. The size, number, and pattern of the solder balls 600 illustrated in FIG. 6 are merely examples. Accordingly, any number and size of solder balls in any pattern is possible as determined by the solder ball size and substrate area, for example.

The outer perimeter of the conductive balls 600 may comprise the solder shield 601 generated utilizing a solder mask opening and a solder reflow process, as illustrated in FIGS. 2-4, for example.

In another example embodiment, one or more inductors may also be generated utilizing a solder mask opening and a solder reflow process to couple conductive balls in a spiral pattern, for example, as is illustrated by the inductor 610. In this manner, large area inductors may be configured to work in conjunction with the solder shield 601 and large area capacitors to reduce noise in the associated electronics.

Figure 7:
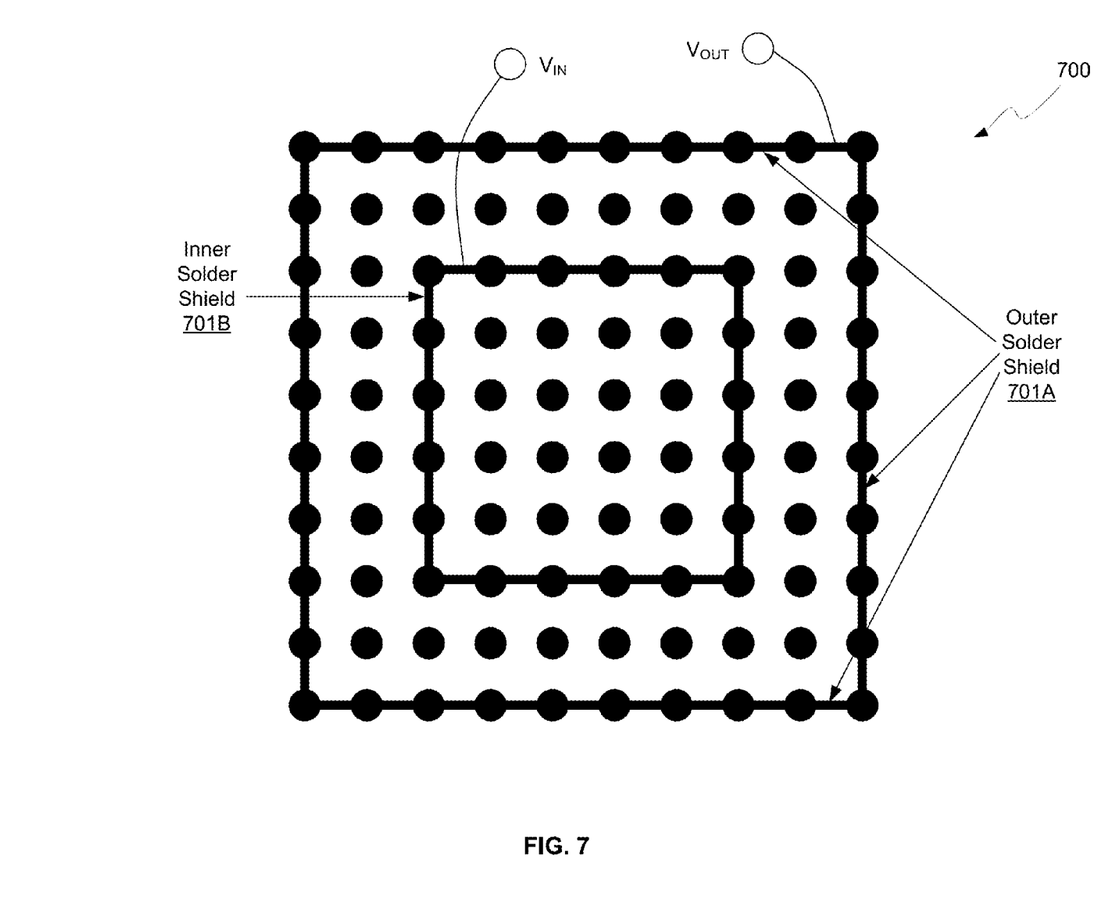
FIG. 7 is a schematic illustrating coupled inner and outer rows of a ball grid array following solder reflow, in accordance with an example embodiment of the invention.

FIG. 7 is a schematic illustrating coupled inner and outer rows of a ball grid array following solder reflow, in accordance with an example embodiment of the invention. Referring to FIG. 7, there is shown conductive balls 700 which form an array of solder balls, similar to the conductive balls illustrated in FIGS. 1A-6. The size, number, and pattern of the conductive balls 700 illustrated in FIG. 7 are merely examples. Accordingly, any number and size of conductive balls in any pattern is possible as determined by the conductive ball size and substrate area, for example.

The outer perimeter of the conductive balls 700 may comprise the outer solder shield 701A generated utilizing a mask layer opening and a solder reflow process, as illustrated in FIGS. 2-6, for example. Similarly, an inner loop of the conductive balls 700 may be coupled utilizing the solder mask opening and solder reflow process, resulting in the inner solder shield 701B. The outer and inner solder shields 701A and 701B may be biased at the potentials $V_{OUT}$ and $V_{IN}$, respectively. In instances where $V_{OUT}$ and $V_{IN}$ are both tied to a ground potential, the conductive balls 700 between the shields may be well shielded from both lateral directions. The use of a solder mask opening and a solder reflow process enables the generation of any number of solder shield and biasing configurations. Note that although FIG. 7 illustrates generally concentric loops, such loops need not necessarily be concentric. For example, such loops may be completely separate from each other. Additionally, for example, such loops need not be in a regular shape (e.g., a perfect square or rectangle). For example, such loops may have irregularly shaped sides.

In an embodiment of the invention, a method and system are disclosed for solder shielding of ball grid arrays. In this regard, aspects of the invention may comprise placing conductive balls 111, 201, 301, 500, 600, 700, forming an array, onto a support structure 207, 307, where the support structure 207, 307 may comprise a contact pad 205 for each of the conductive balls 111, 201, 301, 500, 600, 700 and a subset of the contact pads may be coupled via a solder mask opening 203, 303. A subset of the conductive balls 111, 201, 301, 500, 600, 700 may be coupled utilizing a solder reflow process and via the mask layer opening 203, 303.

The coupled subset of the array of conductive balls 111, 201, 301, 500, 600, 700 may comprise an outer perimeter of the conductive balls 111, 201, 301, 500, 600, 700. The coupled subset of the conductive balls may be coupled to ground. The support structure 207 may comprise an interposer 107. The support structure 207 may comprise an integrated circuit die 101, 121, wherein the coupled subset of conductive balls 111, 201, 301, 500, 600, 700 may shield the integrated circuit from receiving electromagnetic interference.

The support structure 207, 307 may comprise a packaging substrate 103 and the coupled subset of the conductive balls 111, 201, 301, 500, 600, 700 may be coupled to a ground plane 125 in the packaging substrate 103. The support structure 207, 307 may comprise a printed circuit board 131 and the coupled subset of the conductive balls may be coupled to a ground plane 133 in the printed circuit board 131. The subset of the conductive balls 111, 201, 301, 500, 600, 700 may be utilized to generate one or more capacitors 510 and/or one or more inductors 610.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A substrate for a semiconductor package, the substrate comprising:
   an array of contact pads on the substrate for receiving an array of respective conductive balls; and
   a solder mask material layer over the array of contact pads in which pad openings expose the array of contact pads and comprising a channel opening that extends from contact pad to contact pad between a first subset of the array of contact pads, the first subset comprising an outer perimeter of the array of contact pads for which the pad openings are smaller in diameter than the pad openings for a second subset of the array of contact pads that are not part of the first subset;
   wherein the contact pads of the first subset are electrically connected to each other by one or more traces along the channel opening in the solder mask material layer that extend between the first subset of the array of contact pads, the one or more traces comprising material from the conductive balls to form a ground solder shield along the perimeter.

2. The substrate according to claim 1, comprising the respective conductive balls on the subset, which are coupled together utilizing a reflow process such that solder from the conductive balls flows in the channel opening.

3. The substrate according to claim 1, wherein the first subset forms a ring that is coupled to another subset of the array of contact pads within the ring.

4. The substrate according to claim 1, wherein the contact pads of the subset are coupled to ground.

5. The substrate according to claim 1, wherein said subset forms a closed loop inside of which at least one of the contact pads that is not in said subset is positioned.

6. The substrate according to claim 1, comprising the respective conductive balls attached to said first subset of the array of contacts pads, generate one or more reactive elements.

7. An electrical circuit, the circuit comprising:
   a support structure comprising an array of contact pads on the support structure for receiving an array of respective conductive balls;
   a solder mask material layer over the array of contact pads in which pad openings expose the array of contact pads and comprising a channel opening that extends from contact pad to contact pad between a first subset of the array of contact pads, the first subset comprising an outer perimeter of the array of contact pads for which the pad openings are smaller in diameter than the pad openings for a second subset of the array of contact pads that are not part of the first subset; and
   the array of respective conductive balls positioned on the array of contact pads;
   wherein the contact pads of the first subset are electrically connected to each other by one or more traces along the channel opening in the solder mask material layer that extends between the first subset of the array of contact pads, the one or more traces comprising material from the conductive balls to form a ground solder shield along the perimeter.

8. The electrical circuit according to claim 7, wherein the conductive balls on the first subset are coupled utilizing a reflow process such that solder from the conductive balls flows in the channel opening.

9. The electrical circuit according to claim 8, wherein the conductive balls on the first subset, when coupled by the reflow process, form an electromagnetic shield.

10. The electrical circuit according to claim 7, wherein a size of the pad openings for the contact pads in the first subset is different from a size of the pad openings for the contact pads of the array that are not part of the first subset.

11. The electrical circuit according to claim 7, wherein the first subset is coupled to ground.

12. The substrate according to claim 1, wherein the pad openings for the contact pads of the array that are not part of the subset are at least 20% larger in diameter than the pad openings for the contact pads in the subset of the array.

13. The substrate according to claim 1, wherein the contact pads of the subset are coupled to a ground plane of the substrate.

14. The substrate according to claim 1, wherein the traces comprise metal exposed by openings in the solder mask material layer.

15. The electrical circuit according to claim 7, wherein the first subset forms a conductive loop, inside of which at least one of the array of contact pads that is not a member of the first subset is positioned.

16. The electrical circuit according to claim 7, wherein the contact pads of the first subset are coupled to a ground plane of the substrate.

17. The electrical circuit according to claim 7, wherein the pad openings for the contact pads of the array that are not part of the first subset are at least 20% larger than the pad openings for the contact pads in the first subset.

18. The electrical circuit according to claim 7, wherein the respective conductive balls attached to the first subset of the array of contacts pads generate one or more reactive elements.

* * * * *